United States Patent
Alfano et al.

(10) Patent No.: US 9,806,014 B2
(45) Date of Patent: Oct. 31, 2017

(54) INTERPOSER WITH BEYOND RETICLE FIELD CONDUCTOR PADS

(71) Applicants: Michael S. Alfano, Austin, TX (US); Bryan Black, Spicewood, TX (US); Michael Z. Su, Austin, TX (US); Joseph R. Siegel, Brookline, MA (US); Julius E. Din, Reedley, CA (US); Anwar Kashem, Sudbury, MA (US)

(72) Inventors: Michael S. Alfano, Austin, TX (US); Bryan Black, Spicewood, TX (US); Michael Z. Su, Austin, TX (US); Joseph R. Siegel, Brookline, MA (US); Julius E. Din, Reedley, CA (US); Anwar Kashem, Sudbury, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 15/007,791

(22) Filed: Jan. 27, 2016

(65) Prior Publication Data
US 2017/0213787 A1    Jul. 27, 2017

(51) Int. Cl.
| H01L 23/48 | (2006.01) |
| H01L 23/52 | (2006.01) |
| H01L 29/40 | (2006.01) |
| H01L 23/498 | (2006.01) |
| H01L 21/48 | (2006.01) |
| H01L 23/00 | (2006.01) |

(52) U.S. Cl.
CPC .... H01L 23/49838 (2013.01); H01L 21/4846 (2013.01); H01L 24/16 (2013.01); H01L 24/81 (2013.01); *H01L 2224/16227* (2013.01)

(58) Field of Classification Search
CPC ............... H01L 25/042; H01L 2224/97; H01L 2924/18161
USPC ........ 257/778, 723, 724, 701, 784, 786, 797
See application file for complete search history.

(56) References Cited

U.S. PATENT DOCUMENTS

| 2010/0327424 | A1* | 12/2010 | Braunisch ............... H01L 23/13 257/692 |
| 2012/0261838 | A1* | 10/2012 | Braunisch ............... H01L 23/13 257/777 |
| 2013/0214432 | A1* | 8/2013 | Wu ........................ H01L 23/147 257/782 |
| 2015/0262972 | A1* | 9/2015 | Katkar .................. H01L 21/561 257/48 |
| 2015/0311182 | A1* | 10/2015 | Lee ..................... H01L 23/3737 257/734 |

OTHER PUBLICATIONS

Harry J. Levinson, *Principles of Lithography*; 2001; pp. 5-7 and 229-256.

* cited by examiner

*Primary Examiner* — S. V. Clark
(74) *Attorney, Agent, or Firm* — Timothy M. Honeycutt

(57) ABSTRACT

Various interposers and methods of manufacturing related thereto are disclosed. In one aspect, an apparatus is provided that includes an interposer that has a first side and a second side opposite the first side. The first side has a first reticle field and a second reticle field larger than the first reticle field. Plural conductor pads are positioned on the first side in the first reticle field. Plural dummy conductor pads are positioned on the first side in the second reticle field and outside the first reticle field.

15 Claims, 10 Drawing Sheets

INTERPOSER WITH BEYOND RETICLE FIELD CONDUCTOR PADS

BACKGROUND OF THE INVENTION

1. Field of the Invention

This invention relates generally to semiconductor processing, and more particularly to interposers and methods of fabricating the same.

2. Description of the Related Art

Stacked semiconductor chip devices present a host of design and integration challenges for scientists and engineers. Common problems include providing adequate electrical interfaces between the stacked semiconductor chips themselves and between the individual chips and some type of circuit board, such as a motherboard or semiconductor chip package substrate, to which the semiconductor chips are mounted. Still another technical challenge associated with stacked semiconductor chips is testing.

Semiconductor interposers are sometimes used to serve as supporting and interconnect substrates for one or more semiconductor chips. A conventional semiconductor interposer consists of a silicon substrate and metallization to provide electrical pathways. The top side of the interposer typically includes conductor pads for connection to the solder bumps of the stacked chip(s). The bottom side typically includes conductor pads and solder bumps to connect the interposer to a circuit board of one sort or another.

A process flow to transform bare semiconductor wafers into collections of interposers and chips and then mount the semiconductor chips on those interposers, and in-turn the interposers on circuit boards, involves a large number of individual steps. In a conventional process, the photolithography steps to fabricate top side bump pads of interposers are performed using a stepper that consists of a reticle or set of reticles and a reduction lens. The stepper defines a reticle field of the top side. The conventional top side reticle field has a smaller footprint than the interposer. The portion of the interposer outside the reticle field is called an overhang. The overhang is unavailable for conductor pad and solder bump placement in conventional interposer fabrication. This limits the sizes and packing density of chips on conventional interposers.

The present invention is directed to overcoming or reducing the effects of one or more of the foregoing disadvantages.

SUMMARY OF THE INVENTION

In accordance with one aspect of the present invention, an apparatus is provided that includes an interposer that has a first side and a second side opposite the first side. The first side has a first reticle field and a second reticle field larger than the first reticle field. Plural conductor pads are positioned on the first side in the first reticle field. Plural dummy conductor pads are positioned on the first side in the second reticle field and outside the first reticle field.

In accordance with another aspect of the present invention, a semiconductor wafer is provided that includes plural interposers. Each of the interposers has a first side and a second side opposite the first side. The first side has a first reticle field and a second reticle field larger than the first reticle field, plural conductor pads on the first side in the first reticle field and plural dummy conductor pads on the first side in the second reticle field and outside the first reticle field.

In accordance with another aspect of the present invention, a method of manufacturing is provided that includes fabricating plural conductor pads on a first side of an interposer. The interposer has a second side opposite the first side. The first side has a first reticle field and a second reticle field larger than the first reticle field. The plural conductor pads are positioned in the first reticle field. Plural dummy conductor pads are fabricated on the first side in the second reticle field and outside the first reticle field.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various interposers useful for mounting multiple semiconductor chips are disclosed. The interposers include a first or top side and a second or bottom side. The top side includes a first reticle field and plural active conductor pads in the first reticle field. The top side includes a second reticle field that is larger than the first reticle field. There are plural dummy conductor pads in the second reticle field outside the first reticle field. The dummy electrical pads provide for solder bump and chip placement outside the smaller first reticle field. Additional details will now be described.

Figure 1:
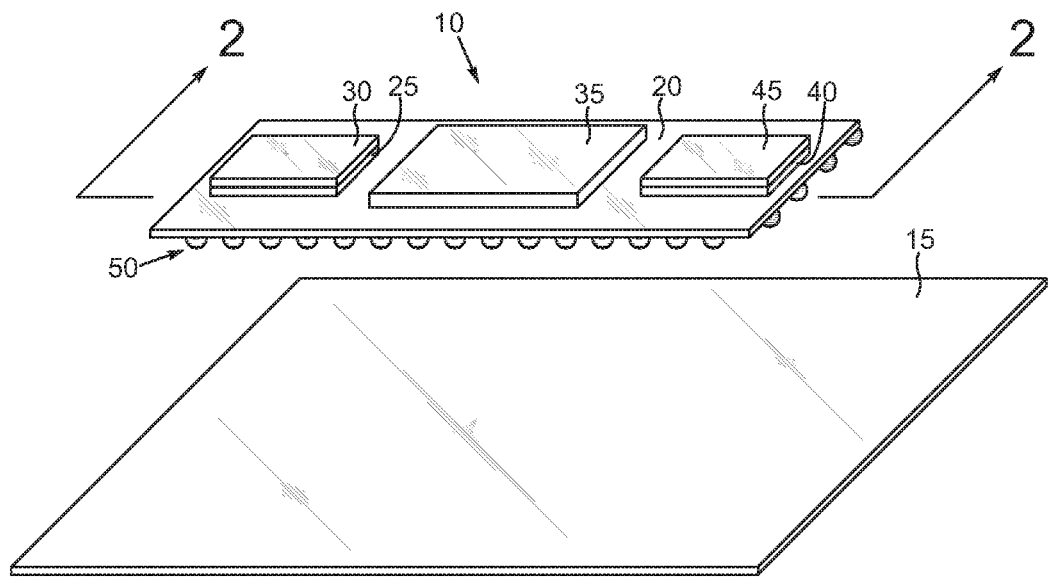
FIG. 1 is a partially exploded pictorial view of an exemplary embodiment of a semiconductor chip device that includes an interposer.

In the drawings described below, reference numerals are generally repeated where identical elements appear in more than one figure. Turning now to the drawings, and in particular to FIG. 1, therein is depicted a partially exploded pictorial view of an exemplary embodiment of a semiconductor chip device 10. The semiconductor chip device 10 may be mounted to a circuit board 15, which may in-turn be mounted in an electronic device (not visible). The semiconductor chip device 10 may include an interposer 20 and multiple semiconductor chips 25, 30, 35, 40 and 45 mounted thereon. The semiconductor chips 25, 30, 35, 40 and 45 may be any of a myriad of different types of circuit devices used in electronics, such as, for example, microprocessors, graphics processors, combined microprocessor/graphics processors, application specific integrated circuits, memory devices, active optical devices, such as lasers, passive optical devices or the like, and may be single or multi-core or even stacked laterally with additional dice. Furthermore, any or all of the semiconductor chips 25, 30, 35, 40 and 45 could be configured as an interposer with or without some logic circuits, and the interposer 20 could be a semiconductor chip. Thus the term "chip" includes an interposer and vice versa. The semiconductor chips 25, 30, 35, 40 and 45 and the interposer 20 may be constructed of bulk semiconductor, such as silicon or germanium, or semiconductor on insulator materials, such as silicon-on-insulator materials, or other chip or even insulating materials. If constructed as a dedicated interposer, the interposer 20 may be composed of a variety of materials suitable for use in a stacked semiconductor chip arrangement. Some desirable properties include, for example, a coefficient of thermal expansion that is relatively close to the CTE's of the semiconductor chips 25, 30, 35, 40 and 45, ease of manufacture, and thermal conductivity. Exemplary materials include, for example, silicon, germanium, sapphire, diamond, carbon nanotubes in a polymer matrix, or the like. To interface electrically with the circuit board 15, the interposer 20 may be provided with plural interconnects 50, which may be in the form of solder balls as depicted or as pins, lands, pillars or other types of interconnect structures as desired.

The number, types and spatial arrangement of the semiconductor chips 25, 30, 35, 40 and 45 may be subject to great variety. Here, the semiconductor chips 25 and 30 are 3D stacked and the semiconductor chips 40 and 45 are similarly 3D stacked, albeit on the opposite side of the semiconductor chip 35.

The circuit board 15 may be a printed circuit board or other type of circuit board. Examples include systems boards, package substrates, circuit cards or others. The circuit board 15 may be constructed as a multi-layer organic, a ceramic substrate or other type.

Figure 2:
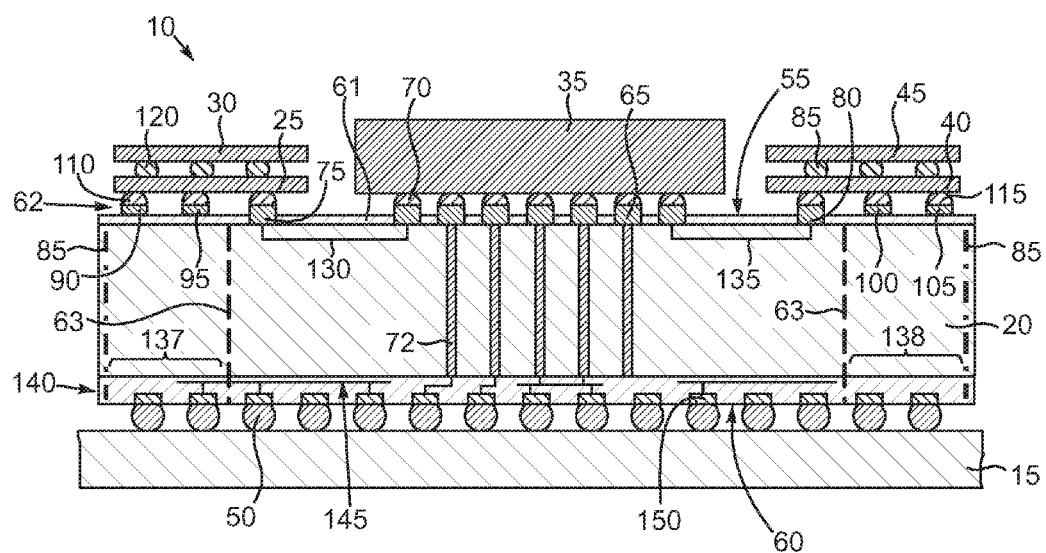
FIG. 2 is a sectional view of FIG. 1 taken at section 2-2.

Additional details of the semiconductor chip device 10 may be understood by referring now also to FIG. 2, which is a sectional view of FIG. 1 taken at section 2-2 albeit with the semiconductor chip device 10 not exploded from the circuit board 15. The interposer 20 has a top side 55 and a bottom side 60. The terms "top" and "bottom" are somewhat arbitrary. The top side 55 may include a passivation layer 61, which may be a unitary insulating structure or a laminate insulating structure and composed of well-known insulating materials, such as silicon dioxide, silicon nitride, polyimide, laminates of these or others. The interposer 20 includes a top metallization layer 62 that includes plural conductor pads. Some of the conductor pads are electrically active and positioned within the lateral confines of a first reticle field of the interposer 20 demarcated by the dashed lines 63. For example, there may be plural conductor pads 65 positioned between the semiconductor chip 35 and the interposer 20 that project up through the passivation layer 61. The conductor pads 65 may be connected to the semiconductor chip 35 by way of corresponding solder structures 70, which may be solder bumps, solder micro bumps, conductive pillars or other structures composed of lead-based solders, lead-free solders, gold, copper or other materials. Some or all of the conductor pads 65 may be connected to respective through vias 72 that extend vertically through the interposer 20. The top metallization layer 62 may also include conductor pads 75 and 80, which are similarly positioned within the first reticle field 63 and which may be used to establish electrical connectivity between with the semiconductor chips 25 and 40 and the interposer 20. The top metallization layer 62 may additionally include conductor pads positioned outside the confines of the first reticle field 63 but within the confines of a second reticle field of the interposer 20 demarcated by the dashed lines 85. The second reticle field 85 is wider than the first reticle field 63 and larger in the dimensions in and out of the page as described in more detail below. For example, there may be conductor pads 90 and 95 positioned outside the first reticle field 63 between the semiconductor chip 25 and the passivation layer 61, and conductor pads 100 and 105 positioned outside the first reticle field 63 and between the semiconductor chip 40 and the passivation layer 61. The conductor pads 90 and 95 may be electrically inactive but fabricated to provide structural support for the semiconductor chip 25, and the conductor pads 100 and 105 may be similarly electrically inactive but provide structural support for the semiconductor chip 40. The conductor pads 90, 95, 100 and 105 may be fabricated on top of the passivation layer 61. In this way, a greater extent of the top side 55 of the interposer 20 may be utilized for chip placement while still providing structural support for those chips 25 and 40 by way of pattern metallization outside the confines of the first reticle field 63. The conductor pads 75, 90 and 95 may be connected to the semiconductor chip 25 by way of corresponding solder structures 110, which may be configured like the solder structures 70 described above. The conductor pads 100 and 105 may be similarly connected to the semiconductor chip 40 by way of solder structures 115, which may be like the solder structures 70 described above. It should be understood that the conductor pads 65, 75, 80, 90, 95, 100 and 105 may be more numerous than what is depicted in FIG. 2. The semiconductor chip 30 may include interconnect structures 120, which electrically connect the chip 30 to the chip 25 and ultimately to the interposer 20 again by way of the interconnect structures 110. The interconnect structures 120 may be configured like the solder structures 70 disclosed above. The semiconductor chip 45 may similarly include interconnect structures 125, which electrically connect the chip 45 to the chip 40 and ultimately to the interposer 20 by way of the interconnect structures 115. Note that the interconnect structures 110 and 115 that are joined to the conductor pads 90, 95, 100 and 105, respectively, will function as dummy bumps in the event that those conductor pads 90, 95, 100 and 105 are electrically inactive. The interposer 20 may include multiple levels of top side metallization other than the top metallization layer 62. For example, conductor trace(s) between the conductor pads 75 and 65 are represented schematically by the conductor line 130 and conductor trace(s) between one of the conductor pads 65 and the conductor pad 80 are represented schematically by way of the conductor line 135. The overhangs 137 and 138 of the interposer 20 are those regions outside of the first reticle field 63 and they include the conductor pads 90, 95, 100 and 105.

The bottom side 60 of the interposer may include a redistribution layer (RDL) structure 140, which may include one or more insulating layers interspersed with plural RDL conductor structures 145 that connect to plural conductor pads 150 and ultimately to the interconnect structures 50. The RDL conductor structures 145 may include numerous traces and layers connected by vias, and, like the conductor pads 150, may take on virtually any type of layout and configuration. Note that some of the conductor pads 150 and the interconnect structures 50 and at least a portion of one or more of the conductor structures or traces 145 are positioned outside the confines of the first reticle field 63 but within the confines of the second reticle field 85.

Figure 3:
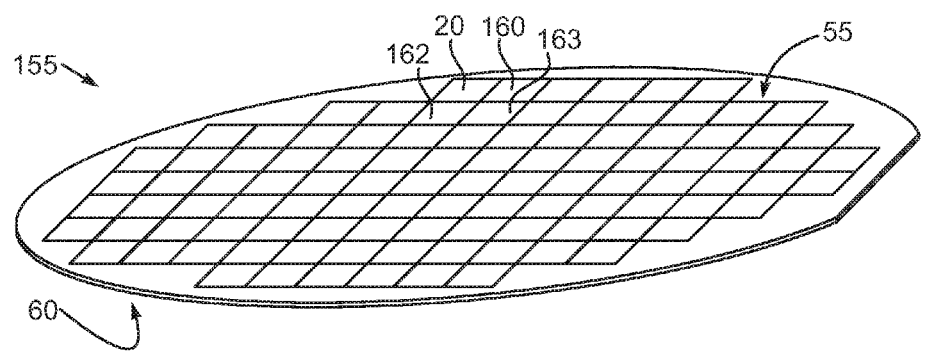
FIG. 3 is a pictorial view of an exemplary semiconductor wafer that includes plural exemplary interposers.
Figure 4:
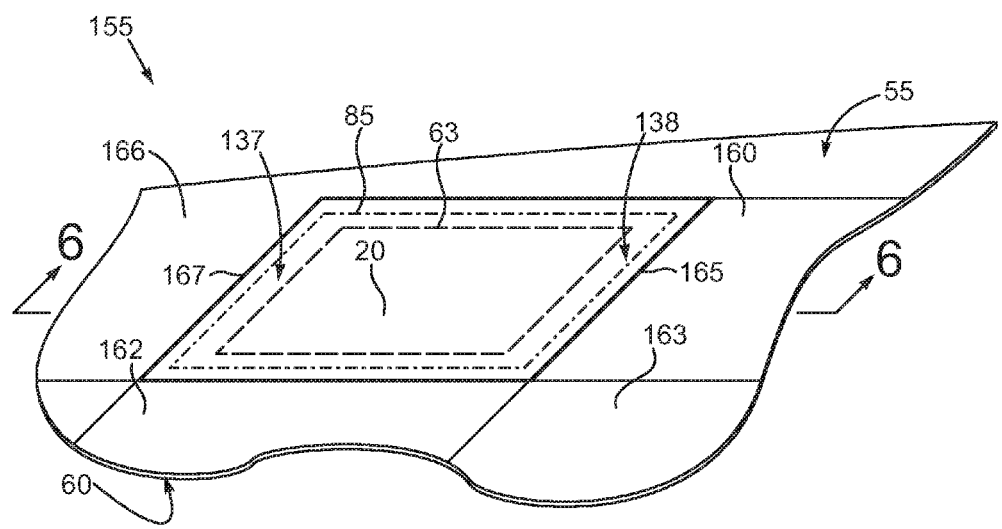
FIG. 4 is a portion of the semiconductor wafer of FIG. 3 blown up.

In FIG. 2, the first reticle field 63 appears as two parallel-spaced dashed lines, but in reality the first reticle field 63 is more typically a rectangular or square region when viewed from above. The same is true of the second reticle field 85. It may be useful at this point to consider FIGS. 3 and 4 to better understand the nature of the first reticle field 63. FIG. 3 is a pictorial view of an exemplary wafer 155. The interposer 20 may be constructed as part of the wafer 155 and thereafter singulated. Accordingly, the wafer 155 includes the top side 55 and the bottom side 60 also depicted in FIG. 2. The wafer 155 may include scores or more additional interposers. A few of the additional interposers adjacent to the interposer 20 are labeled, 160, 162 and 163, respectively. FIG. 4 is a pictorial view of a small portion of the wafer 155 that includes the interposer 20 and portions of the adjacent interposers 160, 162 and 163. The interposer 20 and the interposer 160 are demarcated by a dicing street 165. The interposer 20 and an unused portion 166 of the wafer 155 are demarcated by an oppositely-positioned dicing street 167. The other dicing streets associated with the interposer 20 are shown in FIG. 4, but not labeled. As briefly described above, the first reticle field 63 may be a rectangular region. The second reticle field 85 may similarly be a rectangular region, here depicted by the dot and dashed line. The first reticle field 63 is defined by the region of the top side 55 that may be patterned by way of an exposure reticle(s) and a reduction lens (not shown) configured to enable the patterning of the top most metallization of the top side 55 of the interposer 20 and thus the conductor pads 65, 75, 80, 90, 95, 100 and 105 shown in FIG. 2. The second reticle field 85 is similarly defined by an exposure reticle(s) and reduction lens (not shown) suitable to facilitate the patterning of the bottom side metallization such as the RDL structure 140 including the pads 150 shown in FIG. 2.

The overhangs 137 and 138 of the interposer 20 depicted in FIGS. 2 and 4, that is, those regions of the interposer 20 outside of the first reticle field 63, are, structurally speaking, two portions of the same frame structure. In the illustrative embodiment depicted in FIG. 2, the overhangs 137 and 138 of the interposer 20 include the conductor pads 90, 95, 100 and 105. In a conventional interposer design and process of fabrication thereof, the overhangs 137 and 138 would not be populated with any metallization structures. By enabling the fabrication of the metallization structures in the overhangs 137 and 138, some important benefits are obtained, namely additional supporting structure for the semiconductor chips 25 and 30 as well as the provisioning of perhaps larger semiconductor chips than would ordinarily be feasible for a conventionally produced interposer.

Figure 5:
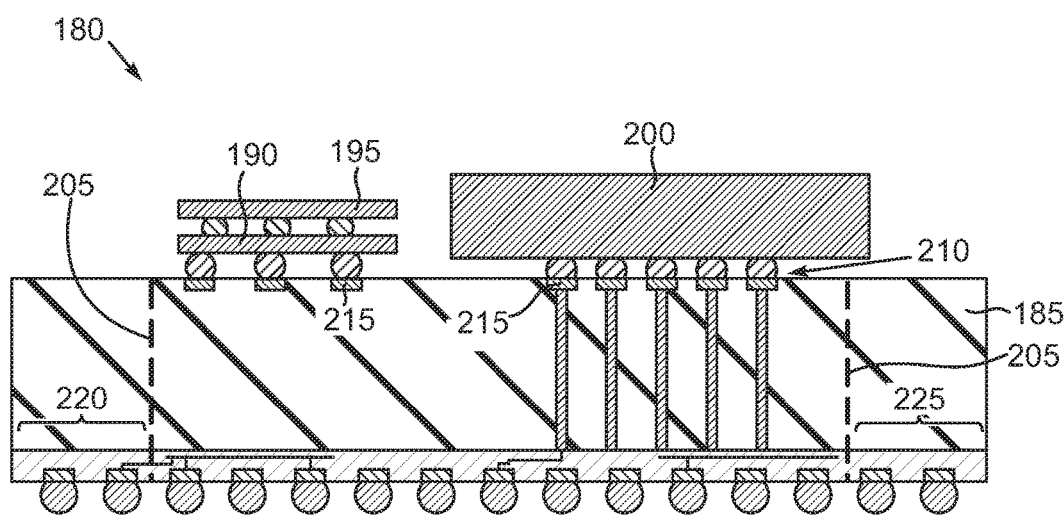
FIG. 5 is a sectional view of an exemplary conventional interposer device.

It may be useful to briefly contrast an exemplary conventional interposer and semiconductor chip design. In this regard, attention is now turned to FIG. 5, which is a sectional view of an exemplary conventional semiconductor chip device 180. The conventional device 180 includes an interposer 185 and semiconductor chips 190 and 195 mounted thereon in a stacked arrangement and another semiconductor chip 200 mounted separately on the interposer 185. Here, the top side reticle field is again denoted by the dashed lines 205. A top-most metallization layer 210 consists of conductor pads 215. Note that the conductor pads 215 are confined to the reticle field 205 such that the overhangs 220 and 225 are not populated with any metallization.

Figure 6:
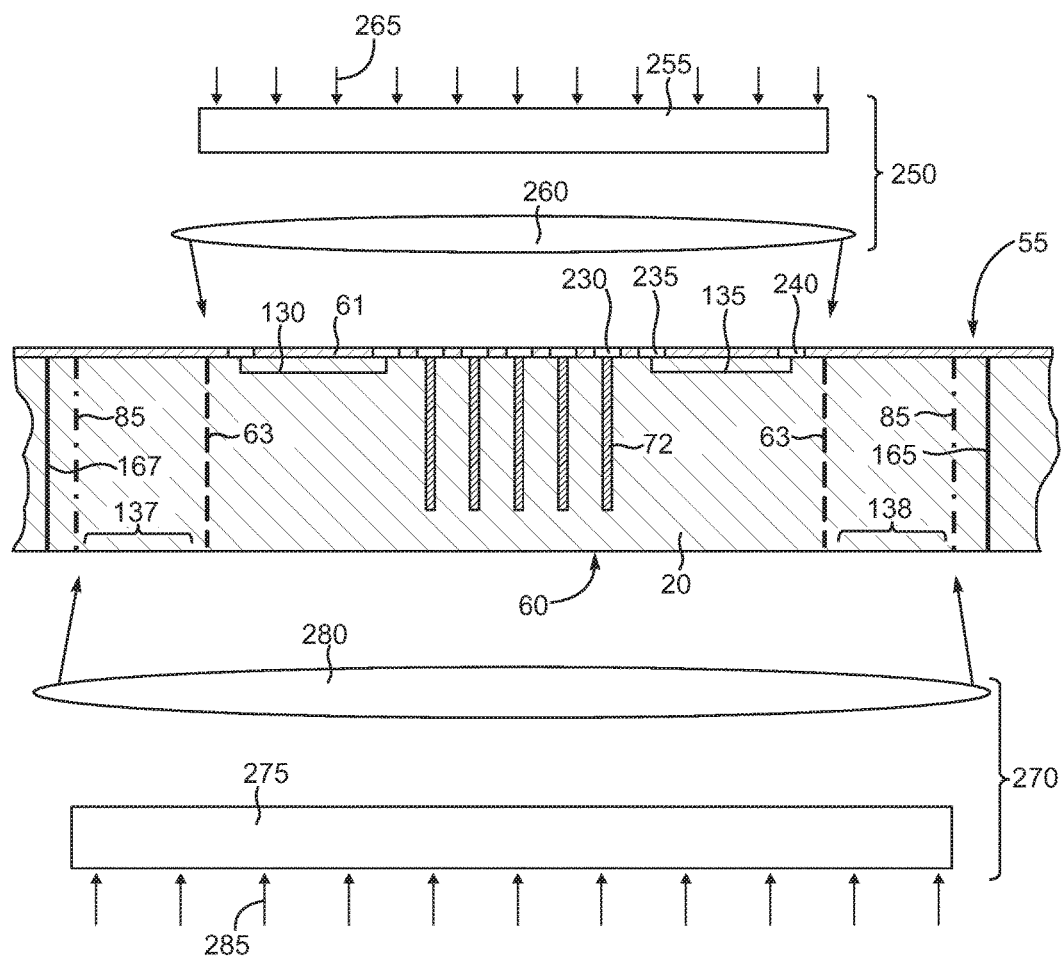
FIG. 6 is sectional view of an exemplary interposer and two photolithography steppers schematically represented.
Figure 7:
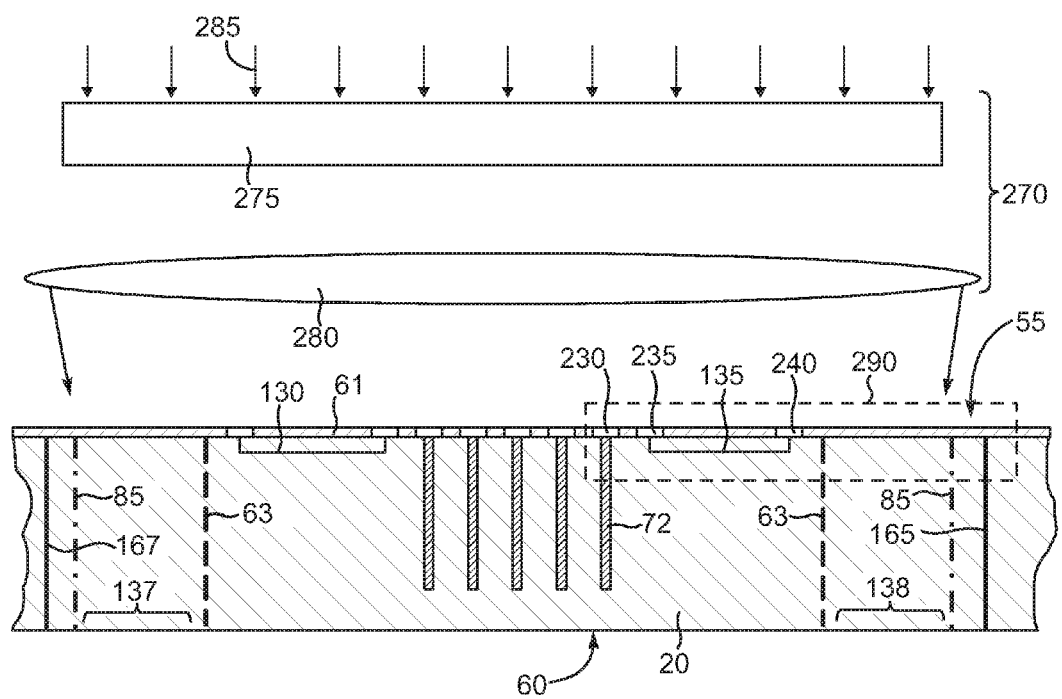
FIG. 7 is a sectional view like FIG. 6, but depicting top side photolithography using one of the schematically represented steppers.

An exemplary method of fabricating aspects of the interposer 20 may be understood by referring now to FIGS. 6 and 7 and initially to FIG. 6. FIG. 6 is a sectional view of the interposer 20 depicted in FIG. 4 but taken at section 6-6. Note that FIG. 6 depicts the interposer 20 prior to: (1) the fabrication of the conductor pads 65, 75, 80, 90, 95, 100 and 105 proximate the top side 55; (2) any thinning processes that will subsequently by performed to expose the through vias 72; and (3) singulation from the semiconductor wafer 155. Note that the dicing streets 165 and 167 are schematically represented by the solid lines and are positioned lateral and external to the second reticle field 85. Up to this point, the interposer 20 may be photolithographically processed to establish the through vias 72, the conductor traces 130 and 135 and plural openings leading to the through vias 72 and the conductor traces 130 and 135. Three of these openings are labeled 230, 235 and 240. These photolithography processes may be performed using a photolithographic stepper schematically represented and designated 250. The stepper 250 includes one or more exposure reticles 255 and a reduction lens 260 that together provide photolithography with the first reticle field 63. Exposure radiation 265 passes through the reticle(s) 255 and the reduction lens 260 to pattern various masks (not shown). The lithographic patterning of the bottom side 60 to establish, for example, the RDL structure 140 depicted in FIG. 2 may be performed using a photolithography stepper schematically represented and designated 270, which includes one or more exposure reticles, one of which is shown and labeled 275 and a reduction lens 280. Exposure radiation 285 passes through the reticle(s) 275 and the reduction lens 280 to expose various masks (not shown). The stepper 270 operates with the second reticle field 85, which is larger than the first reticle field 63. However, and as shown in FIG. 7, the top side 55 of the interposer 20, and in particular the passivation structure 61, may also be photolithographically patterned with the stepper 270 (including the reticle(s) 275 and reduction lens 280) to establish conductor structures (such as the conductor pads 90, 95, 100 and 105 shown in FIG. 2) in the overhangs 137 and 138 after the prior formation of the openings 230, 235 and 240 in the passivation structure 61. If the stepper 270 is ordinarily a bottom side stepper, then in essence a bottom side stepper 270 may be used to perform photolithography on the top side 55 beyond the ordinary limits of the first reticle field 63. It should be understood that the reticle(s) 275 will be tailored to the requisite patterns on the top side 55. Note the location of the dashed box 290. The portion of the interposer 20 circumscribed by the dashed box 290 will be blown up in subsequent figures and used to aid in the description of an exemplary process for patterning the top side 60 using the stepper 270.

Figure 8:
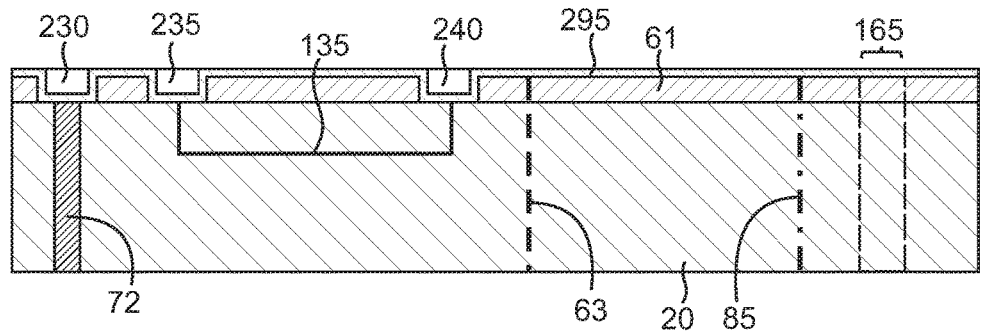
FIG. 8 is a portion of the interposer depicted in FIG. 7 blown up and showing exemplary conductor layer fabrication.
Figure 9:
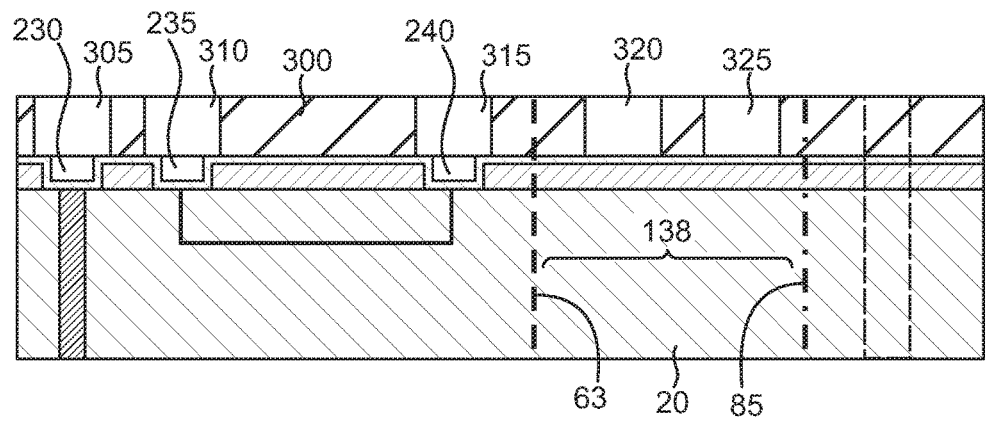
FIG. 9 is a sectional view like FIG. 8, but depicting exemplary masking.
Figure 10:
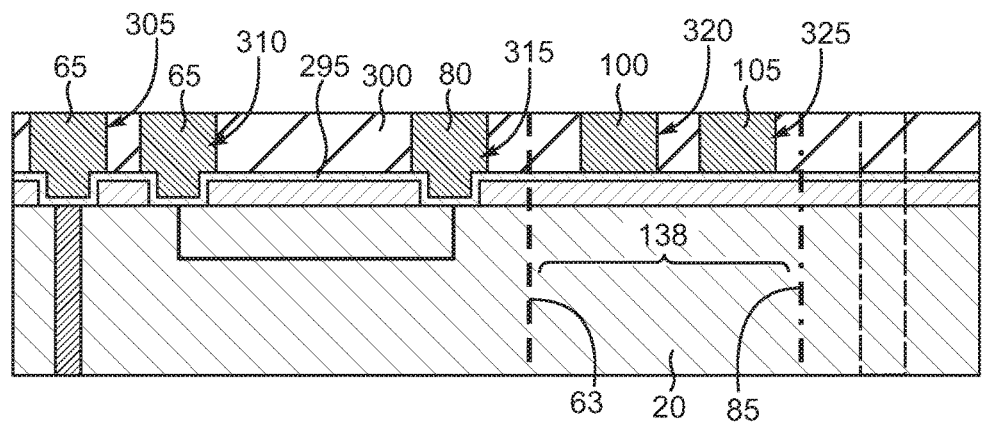
FIG. 10 is a sectional view like FIG. 9, but depicting exemplary active and dummy conductor pad formation.

An exemplary process for fabricating conductor structures in the first reticle field and the second reticle field may be understood by referring now to FIGS. 8, 9 and 10 and initially to FIG. 8. It should be understood that the following description similarly applies to the portion of the interposer 20 on the opposite side of the openings 230, 235 and 240. Because FIG. 8 is blown up in size relative to FIGS. 6 and 7, the dicing street 165 outside of the first reticle field 63 and the second reticle field 85 is now shown in dashed. A conductor layer 295 may be applied to the passivation layer 61 in blanket fashion so that conductor material is deposited into the openings 230, 235 and 240. The conductor layer 295 will be used as a biased plating electrode for a subsequent plating process to establish various conductor structures to be described. The conductor layer 295 is formed in ohmic contact with the underlying conductor structures of the interposer 20, such as the through via 72 and the wiring pattern 135. Various materials may be used for the conductor layer 295, such as copper, gold, platinum, palladium, silver, mixtures of these or others. In an exemplary embodiment, the conductor layer 295 may consist of copper and be applied by an electroless plating process. Of course, a variety of other material application techniques, such as physical vapor deposition, chemical vapor deposition or other techniques may be used.

Next and as shown in FIG. 9 a suitable photolithography mask 300 may be applied to the interposer 20 and patterned using the stepper 270 depicted in FIGS. 6 and 7. The mask 300 may consist of well-known positive tone or negative tone resists and is patterned with plural openings 305, 310 and 315 in alignment with the underlying openings 230, 235 and 240, and additional openings 320 and 325 which are in the overhang 138 and thus outside the first reticle field 63 but inside the second reticle field 85. The openings 320 and 325 will be used to establish the conductor structures 100 and 105 depicted in FIG. 2. Well-known resist spin or other coating techniques, baking, exposure and development techniques may be used.

Next and as shown in FIG. 10, with the mask 300 in place and appropriately patterned, any of a variety of material application techniques, such as plating, physical vapor deposition, chemical vapor deposition or other techniques may be used to establish the conductor pads 65, 80, 100 and 105 on the conductor layer 295 of the interposer 20. Various materials may be used for the conductor pads 65, 80, 100 and 105, such as copper, gold, platinum, palladium, silver, mixtures of these or others. In an exemplary embodiment, the conductor pads 65, 80, 100 and 105 layer may consist of copper and be applied by a plating process. The tops of the conductor pads 100 and 105 in the overhang 138 may have approximately the same elevation as the tops of the conductor pads 65 and 80 in the first reticle field 63. Note that the dicing street 165 is located outside the second reticle field 85.

Figure 11:
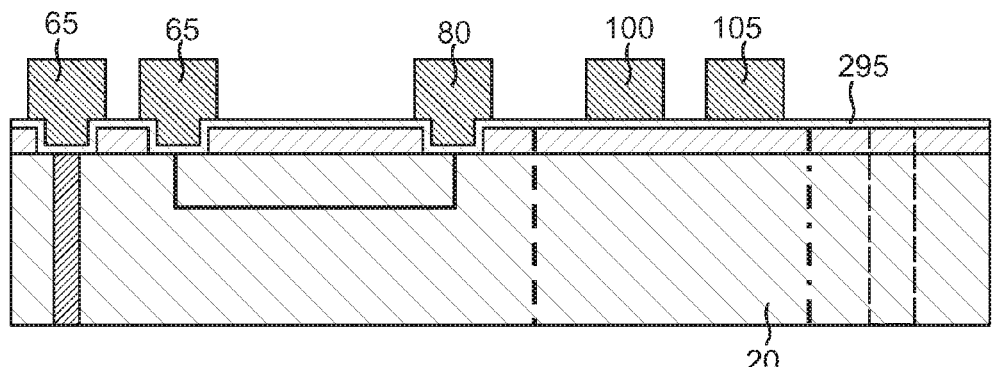
FIG. 11 is a sectional view like FIG. 10, but depicting exemplary mask removal.
Figure 12:
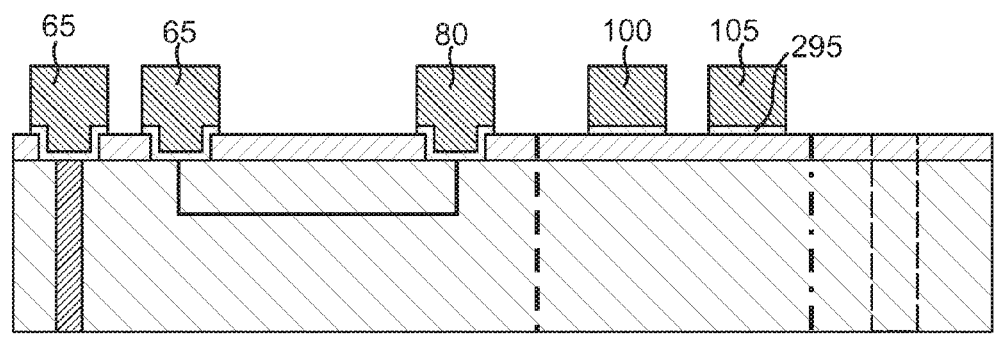
FIG. 12 is a sectional view like FIG. 11, but depicting exemplary conductor layer etching.

Next and as shown in FIG. 11, the mask 300 depicted in FIG. 10 may be stripped from the interposer 20 using ashing, solvent stripping or combinations of these. The stripping process exposes those portions of the conductor layer 295 that are not covered by the conductor pads 65, 80, 100 and 105. Next and as shown in FIG. 12, the conductor layer 295 of the interposer 20 may be etched to remove the exposed portions thereof using the conductor pads 65, 80, 100 and 105 as etch masks. Those portions of the conductor layer 295 beneath the conductor pads 65, 80, 100 and 105 remain.

Figure 13:
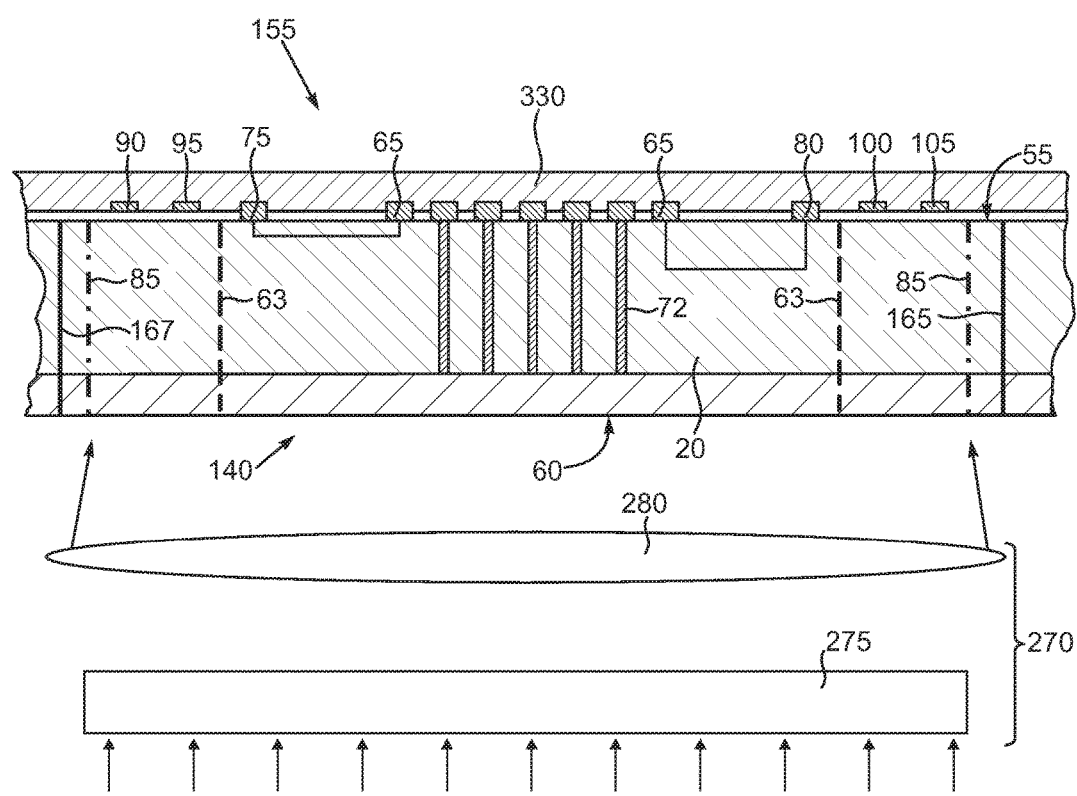
FIG. 13 is a sectional view of an exemplary interposer and a schematically represented stepper for bottom side processing.

Exemplary backside processing will now be described. FIG. 13. FIG. 13 depicts the interposer 20 in section following the fabrication of the conductor pads 65, 80, 90, 95, 100 and 105. Following the construction of those conductor pads 65, 80, 90, 95, 100 and 105, a suitable carrier wafer 330 may be attached to the top side 55 of the interposer 20 and indeed of the entire semiconductor wafer 155 (see FIG. 3) in order to protect the delicate structures positioned at the top side 55. A wafer thinning process may be performed to reveal the lower ends of the through vias 72. Thereafter, the RDL 140 may be constructed using the stepper 270 including the reticle(s) 275 and the reduction lens 280. The processing will proceed outside the first reticle field 63 and according to the second reticle field 85. This may entail metallization deposition and patterning and multiple levels of interlevel insulating layers depending on the number or RDL layers desired. Dicing along the dicing streets 165 and 167 may be performed with or without the carrier wafer 330 in place.

Figure 14:
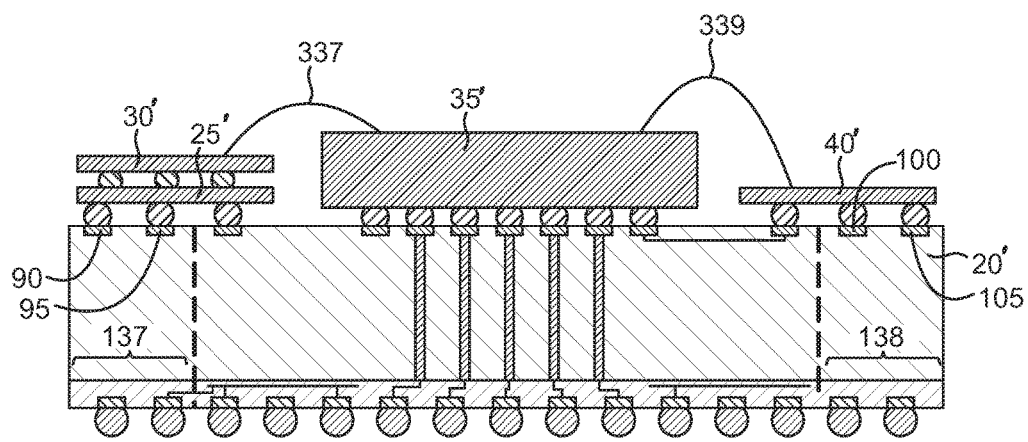
FIG. 14 is a sectional view like FIG. 2, but depicting an alternate exemplary embodiment of a semiconductor chip device that includes an interposer.

It should be understood that a semiconductor chip device utilizing an interposer and multiple semiconductor chips positioned thereon with an expanded reticle field as described elsewhere herein may be used in a great variety of different configurations. For example, FIG. 14 depicts a sectional view of an alternate exemplary interposer 20' upon which semiconductor chips 25', 30', 35' and 40' may be positioned. Here, the semiconductor chips 25' and 30' may be stacked on the interposer 20' with dummy electrical pads 90, 95, 100 and 105 in the overhang 137 and 138 as described above. However, in lieu of an interposer based electrical pathway between the chips 25' and 30' and the chip 35', here one or more wire bonds 337 may be used to connect the chips 25', 30' and 35'. Similarly, one or more wire bonds 339 may be used to connect the chip 40' and 35'. Note here that chip 40' need not be stacked with an additional chip. The material point here is that this represents just one of a great many different types of configurations for not only stacking arrangements but also electrical interfaces between chips and chips and the interposer 20'.

Figure 15:
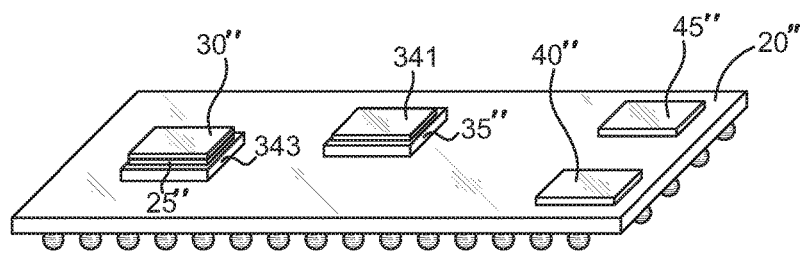
FIG. 15 is a pictorial view of another semiconductor chip device that includes an interposer.

FIG. 15 depicts another alternate exemplary arrangement of an interposer 20". Here, the interposer 20" may be populated with two 2.5D stacked chips 40" and 45" and a stack consisting of two semiconductor chips 341 and 343 positioned lateral to the chips 40" and 45" and a three chip 3D stack consisting of chips 25", 30" and 345. Again, FIG. 15 merely discloses that there are a myriad of different types of arrangements that may be used for chip stacking both in 2.5D and 3D contexts.

Figure 16:
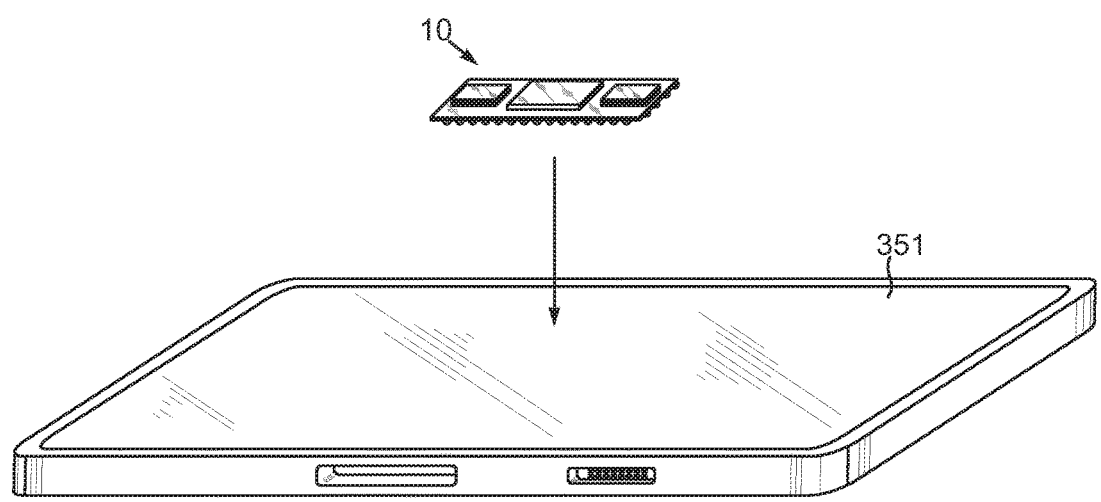
FIG. 16 is a pictorial view of an exemplary interposer exploded from an electronic device.

Any of the disclosed embodiments of the semiconductor chip device, such as the chip device 10 may be positioned in an electronic device as depicted in FIG. 16. The electronic device 351 may be a tablet computer, a smart phone, a general purpose computer, a digital television, a handheld mobile device, a server, a memory device, an add-in board such as a graphics card, or any other computing device employing semiconductors. Other options include testing apparatus, such as probe testers, or virtually any other type of diagnostic apparatus.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
    an interposer having a first side and a second side opposite the first side, the first side having a first reticle field and a second reticle field larger than the first reticle field;
    plural conductor pads on the first side in the first reticle field; and
    plural dummy conductor pads on the first side in the second reticle field and outside the first reticle field.

2. The apparatus of claim 1, comprising a passivation structure on the first side, the dummy conductor pads being positioned on the passivation structure.

3. The apparatus of claim 2, wherein the plural conductor pads project through the passivation structure.

4. The apparatus of claim 1, comprising a first semiconductor chip positioned on the first side and connected to at least one of the dummy conductor pads.

5. The apparatus of claim 4, wherein the first semiconductor chip is connected to at least one of the plural conductor pads.

6. The apparatus of claim 1, wherein the second side includes the second reticle field and plural conductor pads positioned in the second reticle field outside the first reticle field.

7. The apparatus of claim 6, wherein the second side includes at least one metal trace having at least a portion positioned in the second reticle field and outside the first reticle field.

8. The apparatus of claim 1, comprising an electronic device, the interposer being mounted in the electronic device.

9. A semiconductor wafer, comprising:
plural interposers; and
each of the interposers having a first side and a second side opposite the first side, the first side having a first reticle field and a second reticle field larger than the first reticle field, plural conductor pads on the first side in the first reticle field and plural dummy conductor pads on the first side in the second reticle field and outside the first reticle field.

10. The semiconductor wafer of claim 9, wherein each first side includes a passivation structure, the dummy conductor pads being positioned on the passivation structure.

11. The semiconductor wafer of claim 10, wherein the plural conductor pads project through the passivation structure.

12. The semiconductor wafer of claim 9, comprising a first semiconductor chip positioned on each of the first sides and connected to at least one of the dummy conductor pads.

13. The semiconductor wafer of claim 12, wherein each of the first semiconductor chips is connected to at least one of the plural conductor pads.

14. The semiconductor wafer of claim 9, wherein each of the second sides includes the second reticle field and plural conductor pads positioned in the second reticle field outside the first reticle field.

15. The semiconductor wafer of claim 14, wherein each of the second side includes at least one metal trace having at least a portion positioned in the second reticle field and outside the first reticle field.

* * * * *